May 12, 1964 W. E. ZRUBEK 3,133,205

TRANSISTOR PULSE AMPLITUDE DISCRIMINATOR

Filed April 29, 1960

INVENTOR.
WILLIAM E. ZRUBEK

BY

H. H. Losche
ATTORNEYS

United States Patent Office 3,133,205
Patented May 12, 1964

3,133,205
TRANSISTOR PULSE AMPLITUDE DISCRIMINATOR

William E. Zrubek, Glen Burnie, Md., assignor, by mesne assignments, to the United States of America as represented by the Secretary of the Navy
Filed Apr. 29, 1960, Ser. No. 25,811
2 Claims. (Cl. 307—88.5)

Figure 1:
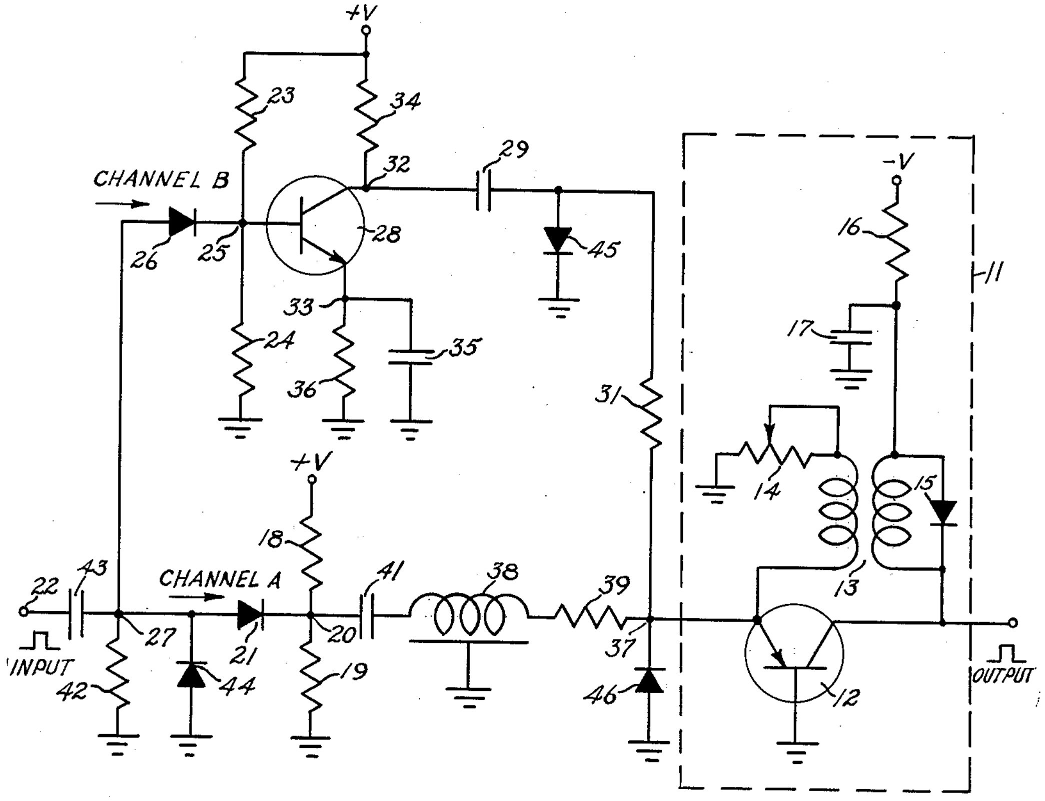

The present invention relates to a pulse amplitude discriminator and more particularly to a circuit that will provide a pulse output only when the amplitude of an input pulse is between two limits.

Heretofore, most presently available discriminators use either thermionic devices or crystal diodes for pulse height selection. Thermionic discriminators have limited performance due to short-term and long-term drifts and sudden jumps. Also the break in the volt-ampere characteristic is not sharp eneough to procure good discrimination. While crystal diodes have none of the disadvantages of thermionic devices, their use as discriminators in pulse height selectors have been limited as crystal diodes, as heretofore used, are reported to have also some serious disadvantages.

The present invention provides a transistorized circuit that will provide a pulse output only when the amplitude of an input pulse is between two limits. This type of circuit is often required in pulse amplitude tracking systems, and also in test equipment as a pulse height analyzer.

In the present invention a blocking oscillator is provided, and, when triggered by a positive pulse, has a pulse output of fixed duration and very low rise and fall times. The output width can be readily varied. The circuit that triggers the blocking oscillator is composed of two parallel channels. One channel has a diode that will block all input pulses whose amplitude is less than a first given value $e_1$. The second channel has a diode that will block all input pulses whose amplitude is less than a second given value $e_2$. The first and second channels are arranged such that when both channels are conducting they will cancel each other and no input wil be received by the blocking oscillator.

Thus it can be seen that an input pulse whose amplitude is less than the first given value $e_1$ will be blocked in both channels, and will have no effect on the blocking oscillator. On the other hand, when an input pulse is received whose amplitude is greater than the first given value $e_1$, but less than the second given value $e_2$, the first channel only will conduct, and the input pulse will be passed to the blocking oscillator, which will generate a pulse output. When an input pulse greater than the second given value $e_2$ is received, both channels will conduct. However, that part of the input pulse greater than the second given value $e_2$ is amplified in the second channel and applied to the blocking oscillator. This establishes a negative voltage for holding off the blocking oscillator even though positive pulses are present. Thus it can be seen that the desired pulse amplitude discrimination between two limits is accomplished.

It is therefore a general object of the present invention to provide an improved pulse amplitude discriminator.

Another object of the present invention is to provide a pulse amplitude discriminator that will provide a pulse output only when the amplitude of an input pulse is between two limits.

Figure 2:
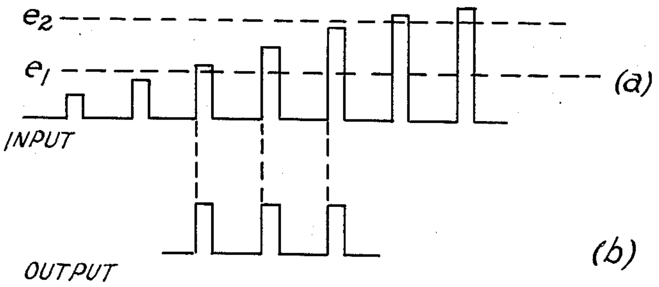

Other objects and advantages of the present invention will be readily appreciated as the same becomes better understood by reference to the following detailed description when considered in connection with the accompanying drawing wherein:

FIG. 1 is a diagram of a circuit showing a preferred embodiment of the invention; and FIG. 2 is a graph illustrating various input and output waveforms.

Referring now to the drawing, and particularly to FIG. 1, a blocking oscillator is shown within the rectangle 11. The oscillator shown is a transistor oscillator, although it will be appreciated that a vacuum tube oscillator may be used as well. The oscillator is comprised of transistor 12, having emitter, collector, and base electrodes, transformer 13, potentiometer 14, diode 15, resistor 16, and capacitor 17. The input of the blocking oscillator is connected to the emitter of transistor 12, and the collector provides the output, with the base electrode being grounded. Potentiomter 14, which is connected to the emitter of transistor 12 through the primary of transformer 13, is provided in order to adjust the width of the output pulse of the blocking oscillator.

The discriminator portion of the circuit is comprised of first and second channels, which for purposes of convenience, are hereinafter referred to as channels A and B. Resistors 18 and 19 are chosen such that the direct current voltage at junction point 20 is at a value of $e_1$, which by way of example, might be 10 volts. Diode 21 such as a crystal diode,which is connected in channel A between pulse input signal terminal 22 and junction point 20, will conduct only for those input pulses that are greater in amplitude than $e_1$. Likewise, resistors 23 and 24 are chosen such that the direct current voltage at junction point 25 is at a value of $e_2$, which by way of example, might be 15 volts. Diode 26, which might also be a crystal diode, is connected between junction point 27 and junction point 25, and will conduct only for those input pulses that are greater in amplitude than $e_2$.

That part of the input pulse greater than $e_2$, which is passed by diode 26, is amplified by means of transistor 28 and applied to the blocking oscillator 11 through capacitor 29 and resistor 31. Transistor 28 has the standard collector, emitter, and base electrodes, and as shown in FIG. 1 of the drawing, the base is connected to junction point 25, and the collector and emitter are connected, respectively, to junction points 32 and 33. Junction point 32 is common to capacitor 29 and resistor 34, and junction point 33 is common to capacitor 35 and resistor 36. One end of capacitor 35 and resistor 36 are connected to ground, while one end of resistor 34 is connected to a voltage source. Likewise, in channel A, resistor 18 is connected to a voltage source and resistor 19 has one end connected to ground.

When that part of the input pulse greater than $e_2$ is amplified by transistor 28, a negative voltage is established at junction point 37. In order to insure that the hold-off bias is present before the trigger pulse arrives through channel A, a delay line 38 is provided in channel A. Resistor 39, which is in series with the emitter-to-base resistance of transistor 12, terminates the delay line in its characteristic impedance. Capacitor 41 is chosen so that the product of its value and the value of resistor 39 is such that it differentiates the current flowing into the emitter of transistor 12. Resistor 42 and capacitor 43 are chosen so that their product is larger than the pulse input width.

It will be understood that circuit specification for the pulse amplitude discriminator shown in FIG. 1 may vary according to the design for any particular application. The following circuit specifications are included by way of example only, suitable for operation when $e_1$ has a value of 10 volts and $e_2$ has a value of 15 volts.

| | | |
|---|---|---|
| Resistor 14 | ohms | 0–100 |
| Resistor 16 | do | 100 |
| Resistor 18 | do | 13,000 |
| Resistor 19 | do | 4,700 |
| Resistor 23 | do | 33,000 |
| Resistor 24 | do | 43,000 |
| Resistor 31 | do | 2,700 |
| Resistor 34 | do | 5,600 |
| Resistor 36 | do | 15,000 |
| Resistor 39 | do | 1,800 |
| Resistor 42 | do | 47,000 |
| Capacitor 17 | μf | 3.5 |
| Capacitor 29 | μf | 3.5 |
| Capacitor 35 | μf | 0.1 |
| Capacitor 41 | μμf | 680 |
| Capacitor 43 | μf | .01 |
| Diode 15 | | 1N34 |
| Diode 21 | | 1N34 |
| Diode 26 | | 1N34 |
| Diode 44 | | 1N34 |
| Diode 45 | | 1N34 |
| Diode 46 | | 1N34 |
| Transistor 12 | | 2N384 |
| Transistor 28 | | 2N167 |
| Delay line 38 (1 microsecond) | ohms | 2000 |
| +V | volts | +28 |
| −V | do | −28 |

In operation, it is desired to provide a pulse output only when the amplitude of an input pulse is between two limits, as shown by FIG. 2. It can be seen that input pulses below the $e_1$ level do not produce an output pulse and also input pulses above the $e_2$ level do not produce output pulses. As the direct current voltage at junction points 20 and 25 are both above the $e_1$ level, diode 21 will block any input pulses below the $e_1$ level from passing through channel A, and likewise diode 26 will block any input pulses below the $e_1$ level from passing through channel B.

When an input pulse greater in amplitude than the value of $e_1$ but less than $e_2$, is received, diode 21 in channel A will conduct, diode 26 will block, and the input pulse will pass to the blocking oscillator 11, which will provide an output pulse.

An input pulse greater in amplitude than the value of $e_2$ will cause both diode 21 and diode 26 to conduct. However, that part of the input pulse greater than $e_2$ is amplified by transistor 28, and consequently a negative voltage is established at junction point 37. Delay line 38 insures that the hold-off bias is present before the trigger pulses arrive. Diode 46 prevents the voltage at junction point 37 from exceeding the reverse base-to-emitter voltage rating of transistor 12.

It can thus be seen that the present invention provides a novel circuit that will provide a pulse output only when the amplitude of an input pulse is between two limits.

Obviously many modifications and variations of the present invention are possible in the light of the above teachings. It is therefore to be understood, that within the scope of the appended claims, the invention may be practiced otherwise than as specifically described.

What is claimed is:

1. A pulse amplitude discriminator for providing a pulse output when the amplitude of an input pulse is between two limits comprising:

a pulse input signal terminal, an output terminal, a first channel connecting said pulse input signal terminal and said output terminal and having a first crystal diode for blocking pulse inputs having amplitudes less than a first predetermined level, a delay line in said first channel connected in series between said first crystal diode and said output terminal, a second channel connected between said pulse input signal terminal and said output terminal and having a second crystal diode for blocking pulse inputs having amplitudes of a second predetermined level, said second predetermined level being greater than said first predetermined level, and an amplifier in said second channel for amplifying that portion of said pulse input that is greater than said first predetermined level.

2. A pulse amplitude discriminator as set forth in claim 1 wherein said amplifier includes a transistor having base, emitter, and collector electrodes, said base electrode being connected to said second crystal diode, said emitter electrode being connected to ground through a resistor, and said collector electrode being connected to a junction point between said delay line and said block oscillator.

References Cited in the file of this patent

UNITED STATES PATENTS

| | | |
|---|---|---|
| 2,683,806 | Moody | July 13, 1954 |
| 2,820,895 | Johnstone | Jan. 21, 1958 |
| 2,821,626 | Freedman | Jan. 28, 1958 |
| 2,883,615 | Gilbert | Apr. 21, 1959 |
| 2,912,577 | Kelley | Nov. 10, 1959 |
| 2,964,708 | Steele | Dec. 13, 1960 |
| 2,970,261 | Zoll | Jan. 31, 1961 |
| 2,972,117 | Jarmotz et al. | Feb. 14, 1961 |
| 3,025,414 | McVey | Mar. 13, 1962 |
| 3,038,089 | Kittrell et al. | June 5, 1962 |